United States Patent
Wang et al.

(10) Patent No.: US 6,297,598 B1
(45) Date of Patent: Oct. 2, 2001

(54) SINGLE-SIDE MOUNTED LIGHT EMITTING DIODE MODULE

(75) Inventors: Bily Wang; Bill Chang, both of Hsin-Chu (TW)

(73) Assignee: Harvatek Corp., Hsin-Chu (TW)

( * ) Notice: Subject to any disclaimer, the term of this patent is extended or adjusted under 35 U.S.C. 154(b) by 0 days.

(21) Appl. No.: 09/785,341

(22) Filed: Feb. 20, 2001

(51) Int. Cl.⁷ .................................................. G09G 3/10
(52) U.S. Cl. ..................... 315/169.3; 315/169.1; 345/905; 361/748; 361/762; 362/800
(58) Field of Search ............... 315/169.3, 169.1; 362/800; 345/88, 905; 361/679, 728, 748, 760, 761, 762

(56) References Cited

U.S. PATENT DOCUMENTS

| | | | | |
|---|---|---|---|---|
| 4,466,050 | * | 8/1984 | Lockard | 362/307 |
| 5,136,479 | * | 8/1992 | Ruffner | 362/800 |
| 5,313,289 | * | 5/1994 | Nagane et al. | 358/475 |
| 6,115,016 | * | 9/2000 | Yoshihara et al. | 345/88 |

* cited by examiner

Primary Examiner—Haissa Philogene
Assistant Examiner—Thuy Vinh Tran
(74) Attorney, Agent, or Firm—H.C. Lin

(57) ABSTRACT

A light emitting diode module is mounted perpendicular to a motherboard, so that the lights emit in a direction parallel to the motherboard. The bottom contacts of the module are lined up on only one side of the module. The contacts are soldered to the motherboard with substrate of the module in vertical position.

9 Claims, 9 Drawing Sheets

SINGLE-SIDE MOUNTED LIGHT EMITTING DIODE MODULE

BACKGROUND OF THE INVENTION (1) Field of the Invention

This invention relates to semiconductor device package, particularly to light emitting diode (LED) package.

(2) Brief Description of the Prior Art

FIG. 1 shows the top view of a tri-color light emitting diode module for providing the back-light for a display panel. An insulating substrate 10 is plated with four separate metallic plates, 11, 12, 13 and 14. A red LED chip 111 has a bottom electrode mounted on the metal plate 11 and a top electrode wire bonded to the common metal plate 14. The green LED chip 112 is mounted on the metal plate 12 and has two top electrodes. One of the electrodes is wire-bonded to metal plate 12, and another electrode is wire-bonded to the common metal plate 14. The blue LED chip 113 is mounted on the metal plate 13 and has two top electrodes. One of the electrodes is wire-bonded to metal plate 13 and another electrode is wire-bonded to the common metal plate 14. The metal plates 11, 12, 13, 14 are wrapped around the corners 121, 122, 123, 124 of the substrate 10 respectively to reach the bottom of the substrate. FIG. 1 illustrates that the LEDs can have both electrodes on top of the chip or have one top electrode and one bottom electrode. While the tri-color LEDs are illustrated to produce full color, it should be pointed out that two color LEDs, eg. red and green, may also be used to produce red, green, yellow and other mixed colors. When two color LEDs are used, only three metal plates (i.e. one more than the number of LEDs) need be used.

FIG. 2 shows the bottom view of the substrate. The extensions of the plates 11, 12, 13 14 at the top surface of the substrate 10 wrapping around the corners 121, 122, 123, 124 respectively become contacts 21, 22, 23, 24 respectively. The contacts are suitable for surface mounting of the LED module to a motherboard.

When such a LED module is used as the back light of a display, the prior art system is shown in FIG. 7. The color module 15 described in FIGS. 1 and 2 is mounted over a plate which is parallel to the display panel 19. The light emitted vertically from module 15 is reflected by a mirror 16 to a light conducting plate 18. The light from the light conducting plate is diffused by a translucent plate 19 to serve as the back light for the display panel 19. In such a system, a mirror is needed to reflect the color lights, because the lights emitted from the module 16 is perpendicular to the display 19.

SUMMARY OF THE INVENTION

An object of this invention is to provide a LED module which emits light in a direction parallel to the motherboard on which the module is mounted. Another object of this invention is to eliminate to use of a reflecting mirror to furnish back light for a light panel.

These objects are achieved by mounting the light emitting diode chips perpendicular to the motherboard so that the light emits in a direction parallel to the motherboard. The bottom contacts of the module are lined up on only one side of the module. These contacts are then soldered to the motherboard with the substrate of the module in a vertical position.

DETAILED DESCRIPTION OF THE PRESENT INVENTION

Figure 4:
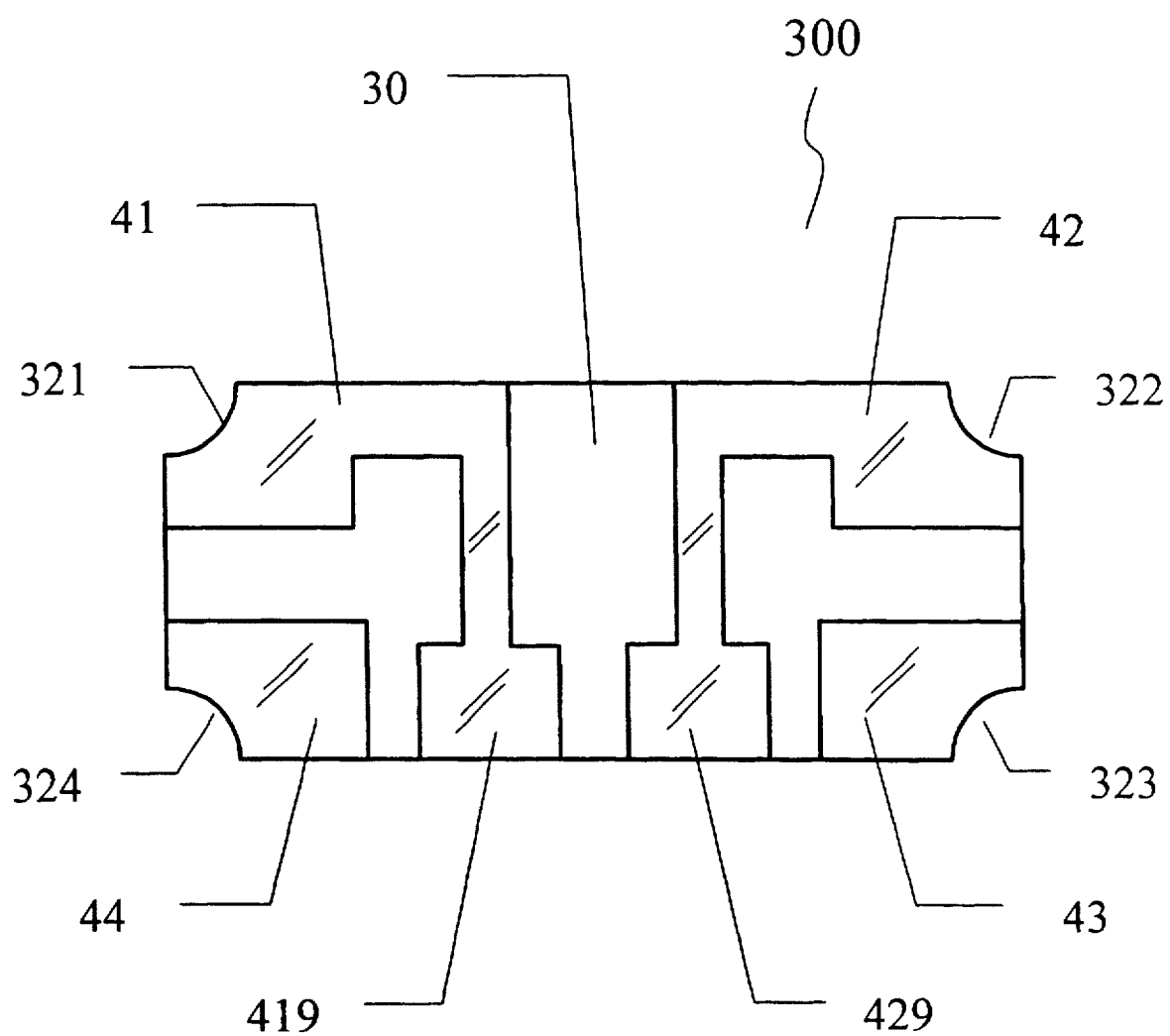
FIG. 4 shows the bottom view of the LED module shown in FIG. 3.
Figure 5:
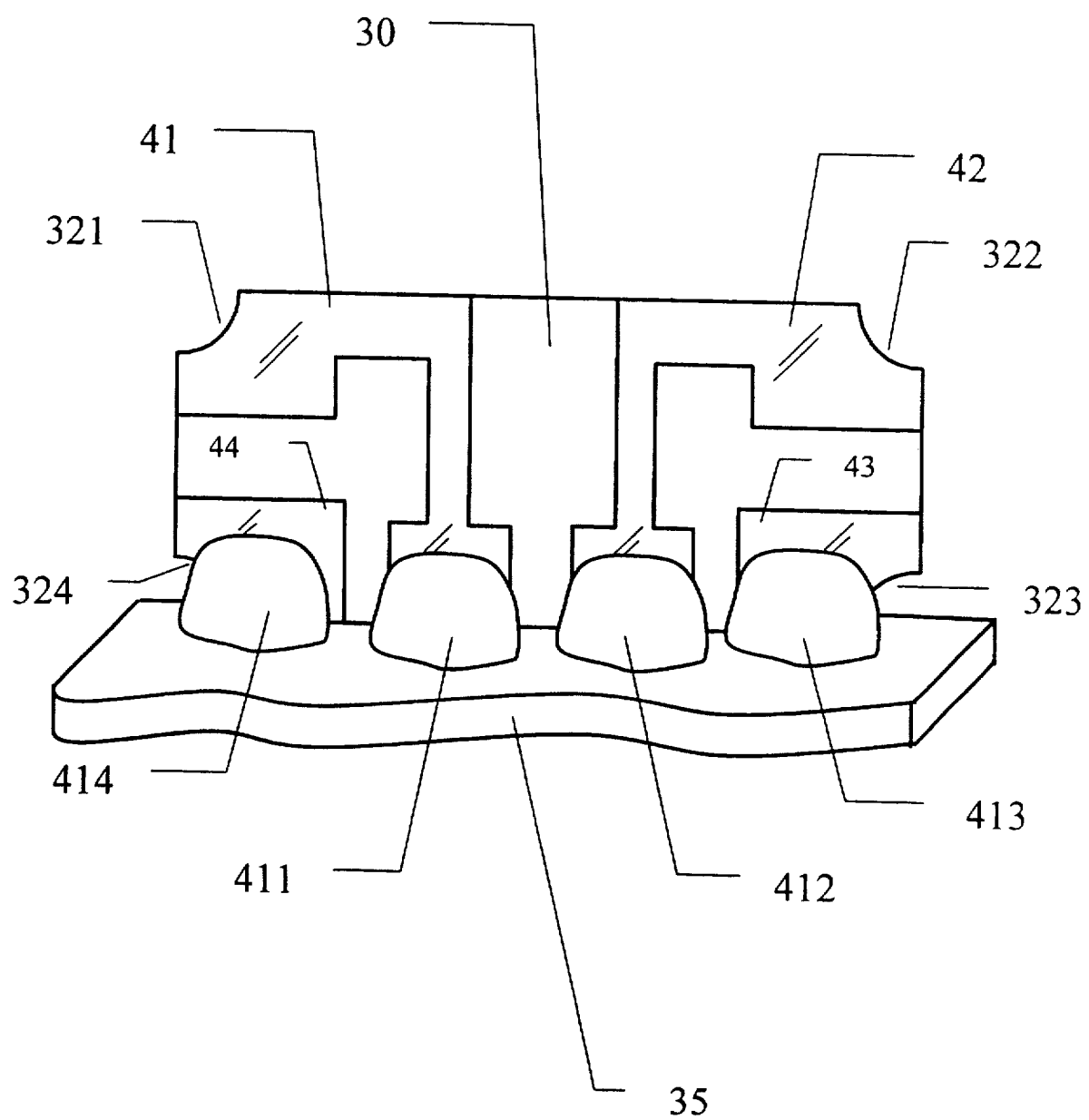
FIG. 5 shows the LED module single side mounted on a motherboard.
Figure 6:
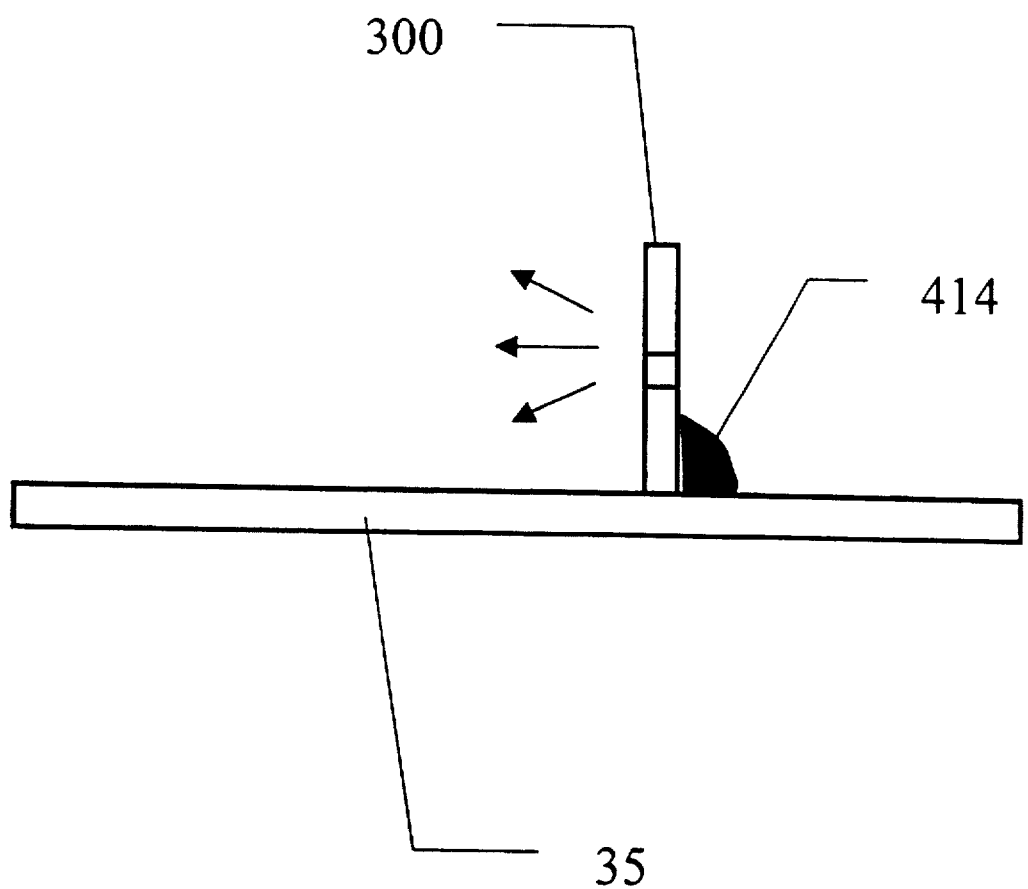
FIG. 6 shows the soldering of the LED module soldered to a motherboard.

The top view of the present invention is shown in FIG. 5. It is the same as that shown in the prior art FIG. 1. However, the metal plates 31, 32, 33, 34, which correspond to metal plates 11, 12, 13, 14 in FIG. 1 and wrap around the corner 321, 322, 323, 324 respectively, have different extensions at the bottom from prior art FIG. 2 as shown in FIG. 4. The ends of the extensions 41, 42, 43, 44 wrapping around the corners 321, 322, 323, 324 respectively all end up and are lined up as contacts 419, 429, 43 and 44 along lower edge of the substrate 30. The substrate 30 is then set upright on the motherboard 35. The contacts 419, 429, 43, 44 are soldered to the motherboard by solders 411, 412, 413, 414 respectively. The solders such as solder 414 makes the module stand up in a vertical direction as shown in FIG. 6. Because of the upright position of the module, the lights from the LED emit light in a horizontal direction parallel to the substrate 35.

Figure 7:
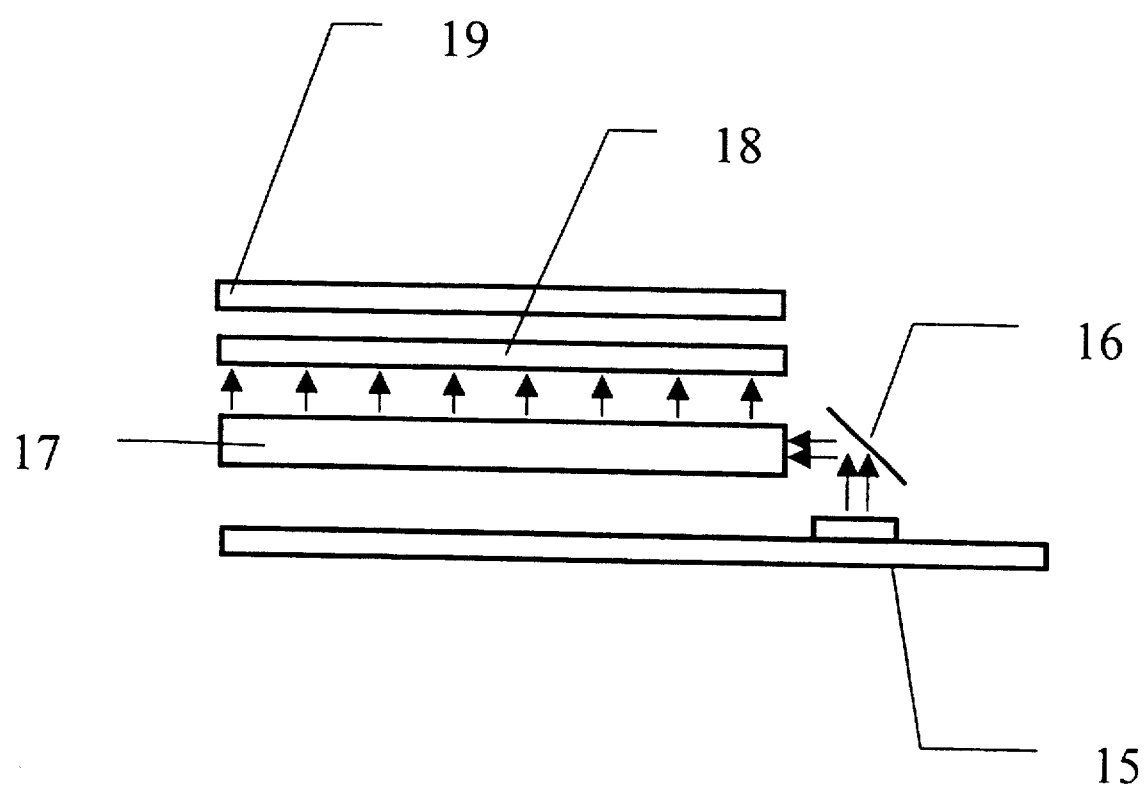
FIG. 7 shows a prior art background lighting system for a display panel.
Figure 8:
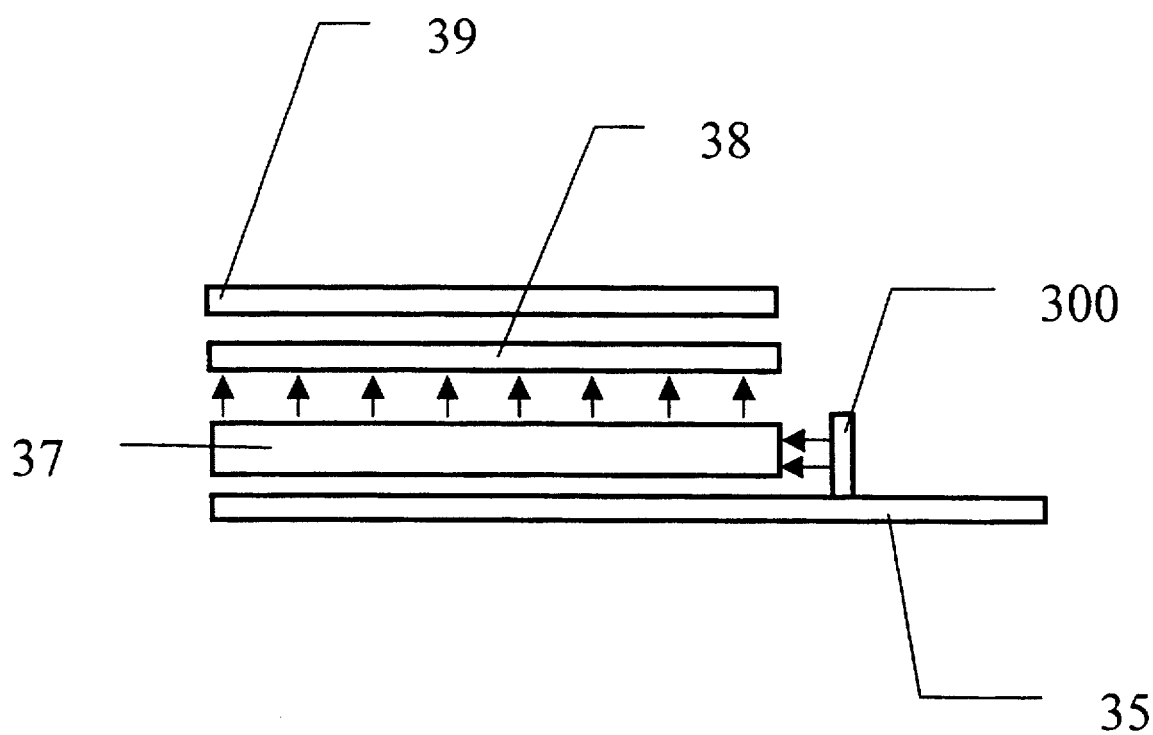
FIG. 8 shows the background lighting system for a display panel based on the present invention.

Such an end-soldered module is useful in a back-lighted panel display as shown in FIG. 8. The end-soldered LED module 300 stands up vertically on the motherboard 35. The lights from the module 300 are emitted in a horizontal direction, parallel to the motherboard 35. The horizontal lights then travel to the light conductor 37, and radiate through a translucent diffuser 38 to serve as the back light for the light panel 39. Compared with the prior art back light system shown in FIG. 7, the present invention does not need a reflecting mirror 16.

Figure 1:
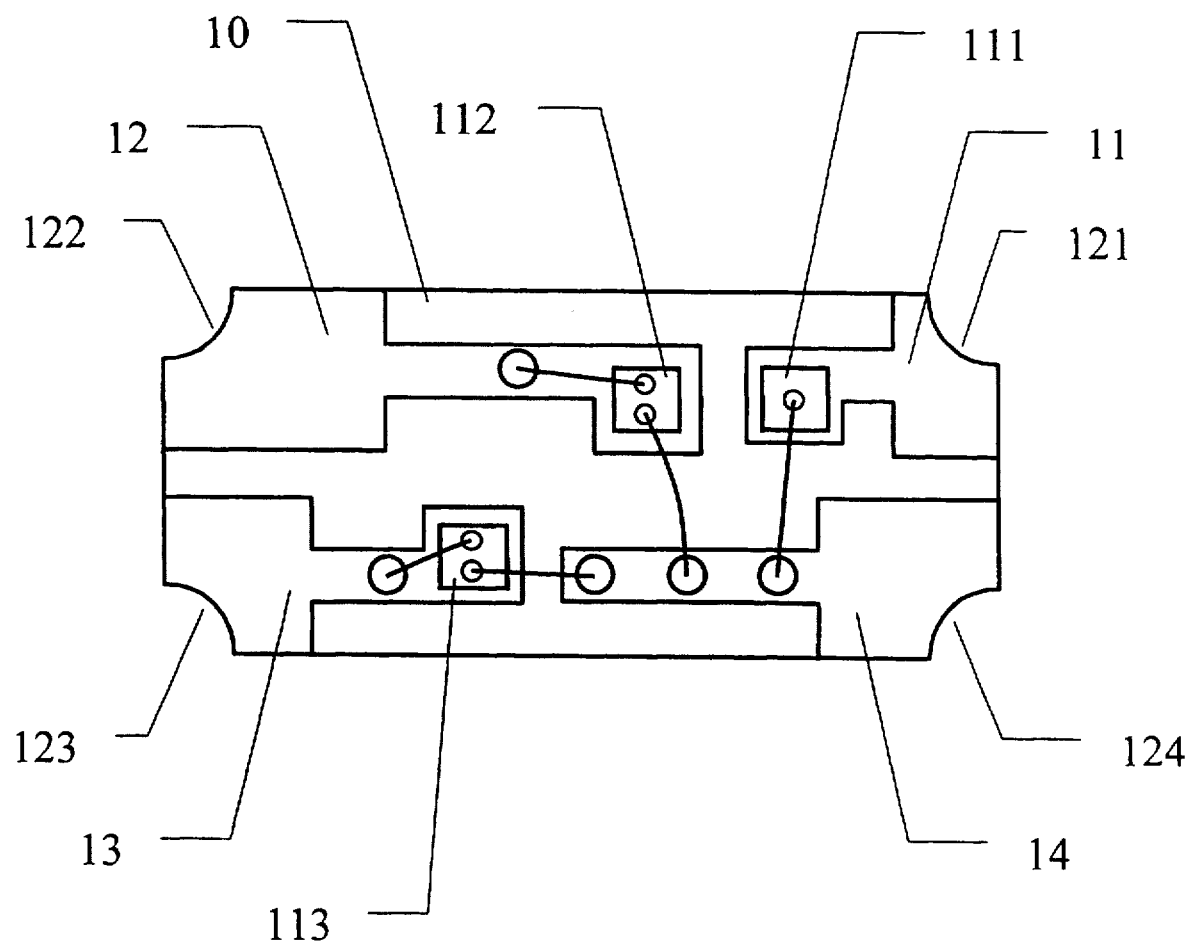
FIG. 1 shows the top view of a prior art LED module.
Figure 2:
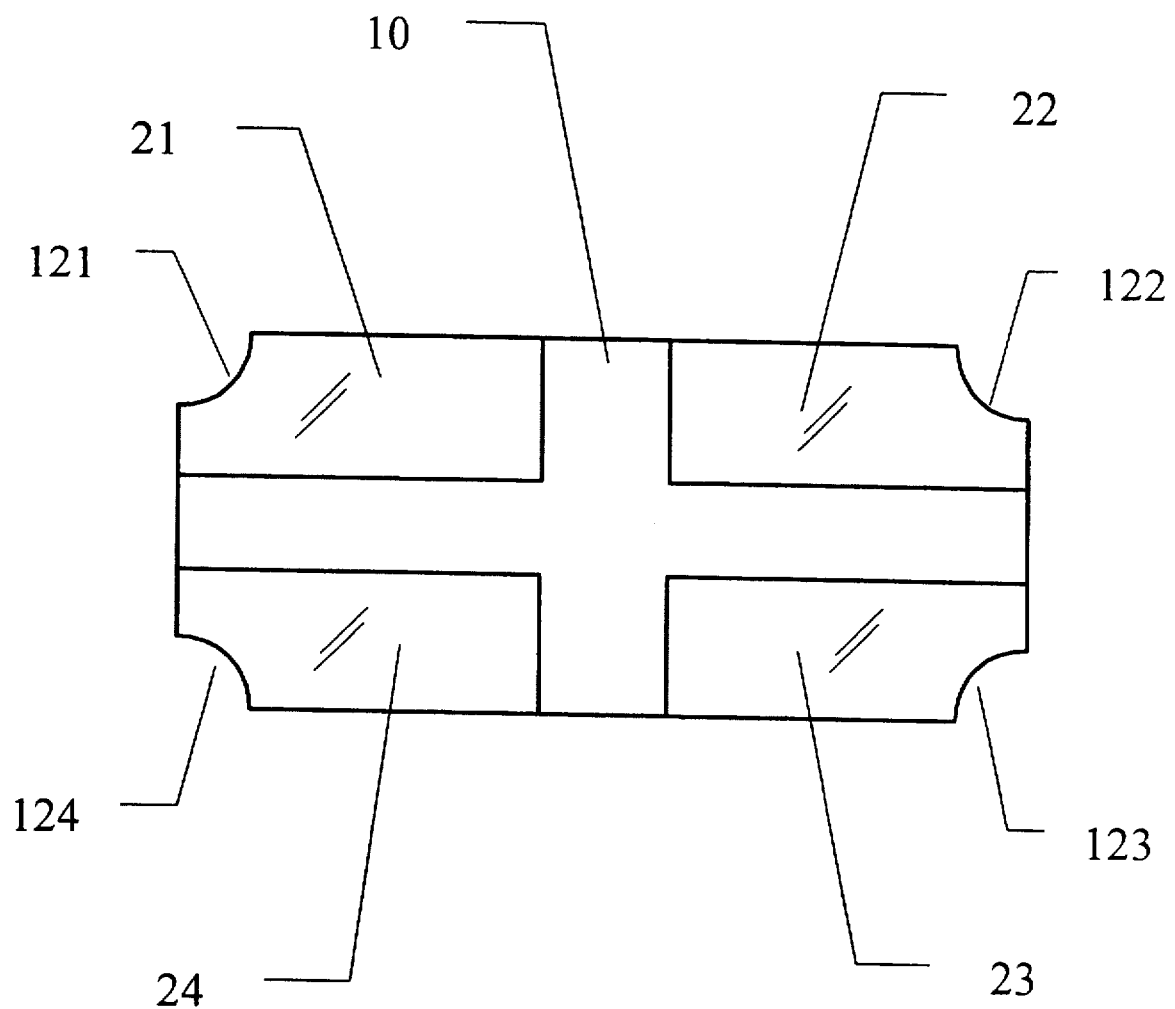
FIG. 2 shows the bottom view of the LED module shown in FIG. 1.
Figure 3:
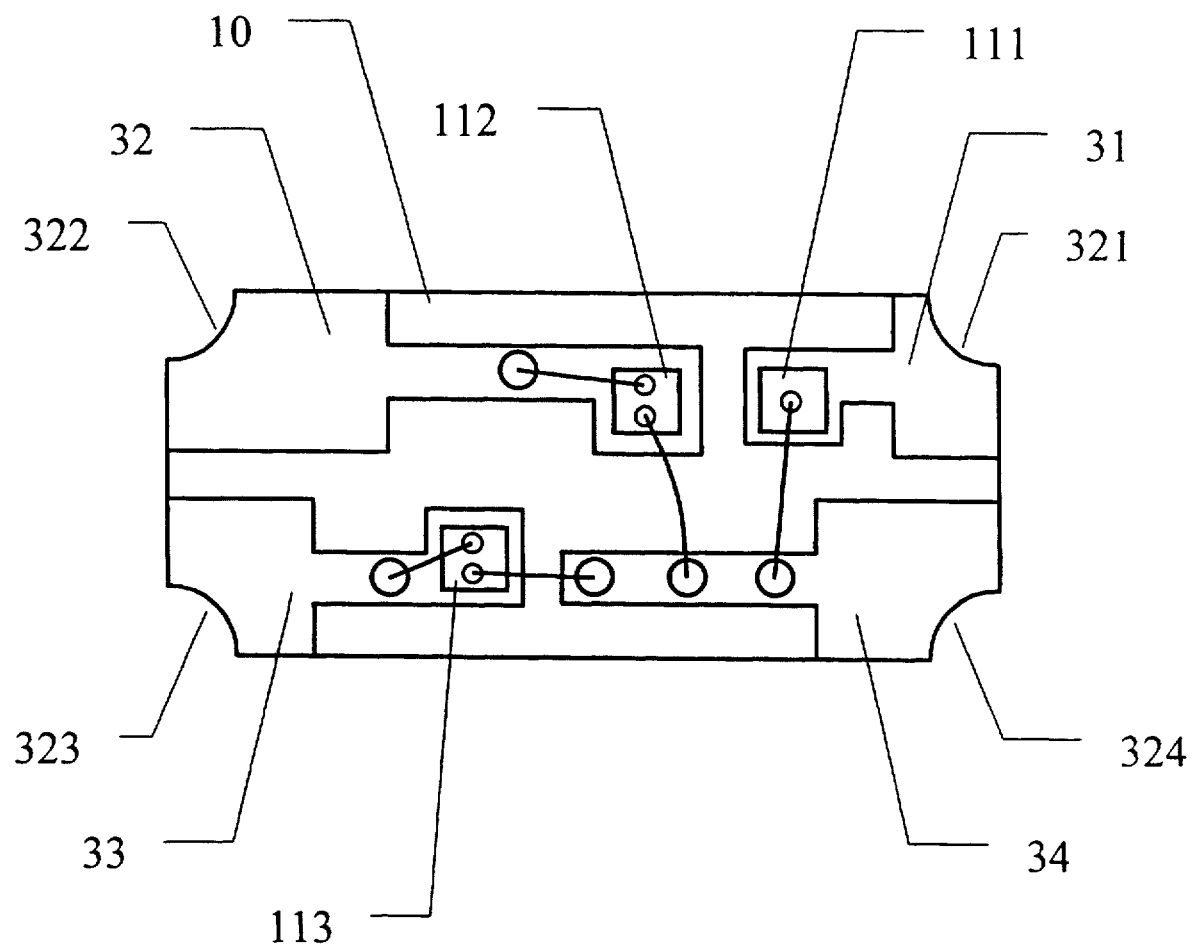
FIG. 3 shows the top view of the LED module of the present invention.
Figure 9:
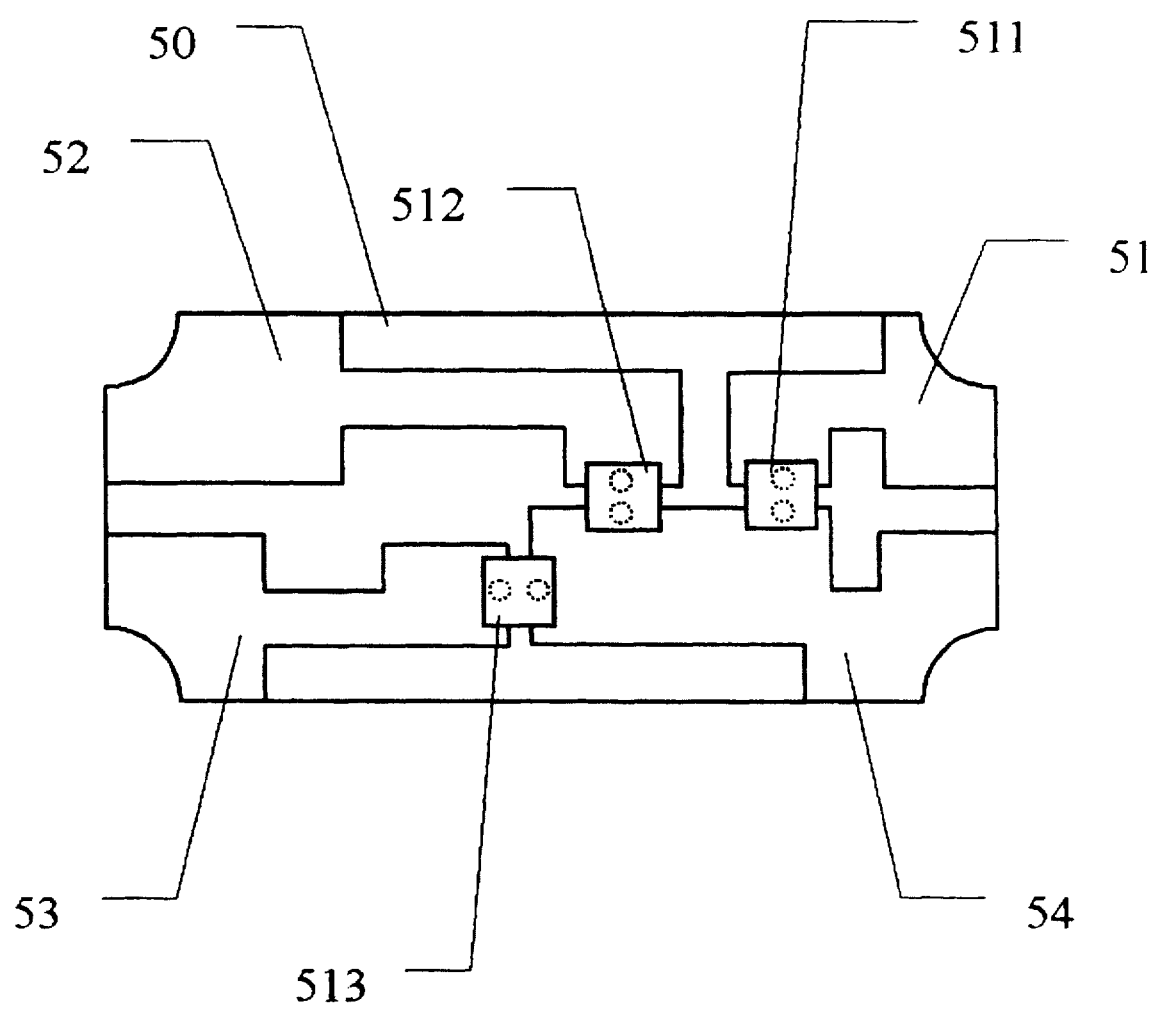
FIG. 9 shows the top view of another embodiment of another embodiment of the present invention.

While wire-bonding is used to couple the electrodes of the LEDs in FIG. 1 and FIG. 3, it should be pointed out other means of coupling may also be used to make the connections. Although the diode chip shown in FIG. 3 has either two top electrodes or one top electrode and one bottom electrode, LED diode chips may also have two bottom electrodes as shown in FIG. 9. Each of the diodes 511, 512, 513 has two bottom electrodes. Each diode straddles across two metal plate as a flip-chip. Thus, diode 511 straddles over the metal plate 51 and the common metal plate 54; diode 512 straddles over the metal plate 52 and the common metal plate 54; and diode 513 straddles over the metal plate 53 and the common metal plate 54. These metal plates are wrapped over the corners as in FIG. 3

While the preferred embodiment of the invention has been described, it will be apparent to those skilled in the art that various modifications may be made in the embodiment without departing from the spirit of the present invention. Such modifications are all within the scope of this invention.

What is claimed is:

1. A light emitting diode module, comprising:

an insulating substrate;

a plurality of metal plates patterned over the top surface of said substrate;

more than one light emitting diodes (LED) each mounted over respective said metal plates;

one electrode of the electrodes of each of said LED coupled to a first metal plate of one of said metal plates and a second electrode coupled to a common metal plate of said metal plates;

extensions of each of said metal plates wrapping around said substrate to form contacts at the bottom surface of said substrate;

ends of said corners lined up along one edge of said substrate; and solders to solder said ends to a motherboard in such a way for the LEDs to emit light in a direction parallel to said motherboard.

2. The light emitting diode module as described in claim 1, wherein there are three said LEDs and four said metal plates.

3. The light emitting diode module as described in claim 2, wherein the three said LEDs are in green, red and blue colors.

4. The light emitting diode module as described in claim 2, wherein said electrodes are selected from the combinations of: a top electrode and a bottom electrode, two top electrodes and two bottom electrodes.

5. The light emitting diode module as described in claim 4, wherein said two bottom electrodes straddles over two said metal plates.

6. The light emitting diode module as described in claim 1, wherein there are two said LEDs and three said metal plates.

7. The light emitting diode module as described in claim 6, wherein said LEDs are in red and green colors.

8. The light emitting diode module as described in claim 1, wherein said LEDs are coupled to the metal plates by means of wire-bonding.

9. A back light display panel, comprising:

a light emitting diode (LED) module mounted on a motherboard having lights emitted in a direction perpendicular to the motherboard;

a light conductor fed by lights emitted from said light emitting diode module;

a light diffuser to diffuse light from said light conductor, and light panel using a the diffused light from said light diffuser as a back light;

wherein said light emitting diode module comprises:

an insulating substrate, a plurality of metal plates patterned over the top surface of said substrate, more than one LED each mounted over respective said metal plates, one electrode of the electrodes of each of said LED coupled to a first metal plates of said metals plates and a second electrode wire-bonded to a common metal plate of said metal plates, extensions of each of said metal plates wrapping around said substrate to form contacts at the bottom surface of said substrate, ends of said contacts lined up along one edge of said substrate, and solders to solder said ends to a motherboard in such a way for the LEDs to emit light in a direction parallel to said motherboard.

* * * * *

UNITED STATES PATENT AND TRADEMARK OFFICE
CERTIFICATE OF CORRECTION

PATENT NO. : 6,297,598 B1
DATED : October 2, 2001
INVENTOR(S) : Bily Wang and Bill Chang It is certified that error appears in the above-identified patent and that said Letters Patent is hereby corrected as shown below:

Column 3,
Line 16, change the word "corners" to -- contacts --.

Signed and Sealed this

Thirtieth Day of September, 2003

JAMES E. ROGAN
*Director of the United States Patent and Trademark Office*